United States Patent [19]
Frankeny et al.

[11] Patent Number: 4,903,113
[45] Date of Patent: Feb. 20, 1990

[54] ENHANCED TAB PACKAGE

[75] Inventors: Richard F. Frankeny, Elgin; James M. Rakes, Leander, both of Tex.

[73] Assignee: International Business Machines Corporation, Armonk, N.Y.

[21] Appl. No.: 145,808

[22] Filed: Jan. 15, 1988

[51] Int. Cl.$^4$ .............................................. H01L 23/14
[52] U.S. Cl. .................................... 357/70; 357/74; 361/306; 361/400; 361/406; 174/52.4
[58] Field of Search ................ 361/306, 400, 406; 174/52 FP; 357/70, 74

[56] References Cited

U.S. PATENT DOCUMENTS

| | | | |
|---|---|---|---|
| H416 | 1/1988 | Covin | 361/306 |
| 3,887,783 | 6/1975 | Comette et al. | |
| 4,539,472 | 9/1985 | Poetker et al. | |
| 4,551,746 | 11/1985 | Gilbert | 357/80 |
| 4,577,214 | 3/1986 | Schaper | |
| 4,587,548 | 5/1986 | Grabbe | 357/78 |
| 4,598,307 | 7/1986 | Wakabayashi et al. | |
| 4,774,635 | 9/1988 | Greenberg | 361/421 |

FOREIGN PATENT DOCUMENTS

| | | | |
|---|---|---|---|
| 0046572 | 4/1980 | Japan | 357/80 |
| 125637 | 9/1980 | Japan | |

OTHER PUBLICATIONS

I. Feinberg et al., "Low Inductance Decoupling Capacitor Connection", IBM Technical Disclosure Bulletin, vol. 28, No. 7, Dec., 1985, p. 2827.

*Primary Examiner*—Andrew J. James
*Assistant Examiner*—David Soltz
*Attorney, Agent, or Firm*—Andrea P. Bryant

[57] ABSTRACT

Improved tape automated bonding (TAB) packaging technology is disclosed having particular utility with semiconductor integrated circuit chips having high gate count and I/O requirements, utilizing a polymer layer of the package to support decoupling capacitor(s) mounted across power and ground leads connecting the chip and internal planes of a printed circuit board to which the TAB package is attached.

5 Claims, 3 Drawing Sheets

ENHANCED TAB PACKAGE

BACKGROUND OF THE INVENTION

1. Field of the Invention

The present invention relates to electronic device packaging. More specifically, it relates to improvements in TAB packaging for semiconductor chip devices and has particular utility with those devices having high numbers of output lines.

2. Description of the Prior Art

Conventional TAB packaging is well known in the art. Typically, a polymer film having a length dimension much greater than its width for eventual storage on a reel-like device is provided with evenly spaced apertures. Using conventional techniques, conductive lines are supplied around each aperture with their ends cantilevered into the aperture. These ends are subsequently attached as appropriate to a semiconductor device, one per aperture, as for example shown in U.S. Pat. No. 3,887,783 to Comette, FIG. 1. A similar structure is shown in Japanese patent abstract 125637.

TAB packages generally enable packaging of chips with a high number of I/O connections and can be easily automated for mass handling. However, such a package has higher inductance in connecting leads than corresponding prior art connection technologies such as used with pin grid array packaging.

IBM Technical Disclosure Bulletin, Vol. 28, No. 7, December, 1985, page 2827, relates to low inductance decoupling capacitor connection and discloses placing a capacitor on a module at each corner of the chip.

U.S. Pat. No. 4,577,214 to Schaper discloses a semiconductor package with low inductance power/ground leads in the package and uses a capacitor. Similarly, U.S. Pat. No. 4,598,307 recognizes the need for mounting a bypass capacitor as close as possible to an integrated circuit chip and uses specific unused real estate area of a dual in-line package for mounting a capacitor.

U.S. Pat. No. 4,539,472 discloses interconnecting a plurality of TAB devices as opposed to the conventional technique of having one logic chip within a frame of the tape. Additionally, means are disclosed for connecting apparently from the underside of the active integrated circuit chip device to a lead pattern formed on a substantially rigid substrate.

SUMMARY OF THE INVENTION

The present invention relates to a TAB package for high gate count integrated circuits and provides means for offsetting the negative characteristic of high lead inductance by using the polymer layer of a TAB package to support capacitor(s) across power and ground leads going to the chip in conjunction with ground distribution layers on the card to which the device is eventually attached. Surface mountable capacitors as well as film capacitors mounted on the first level of TAB package may be used. The present invention thereby greatly expands performance characteristics of TAB packages.

The inductance of the power and ground leads of the TAB package causes a voltage drop across the leads of the package when high switched current (di/dt) is applied due to either large numbers of simultaneous switching drivers (SSD) or large numbers of internal gates. This characteristic of a TAB package would otherwise limit its use in high performance applications and require a much more expensive package. The present invention avoids going to a more expensive package by utilizing the polymer layer of a TAB package to support capacitors across the power and ground leads.

BRIEF DESCRIPTION OF THE DRAWING

The above and other features and advantages of the present invention will be better understood from the following description taken in connection with the following drawings, where in all figures the same reference numerals are used to represent the same elements, wherein.

DESCRIPTION OF THE PREFERRED EMBODIMENT

Figure 1:
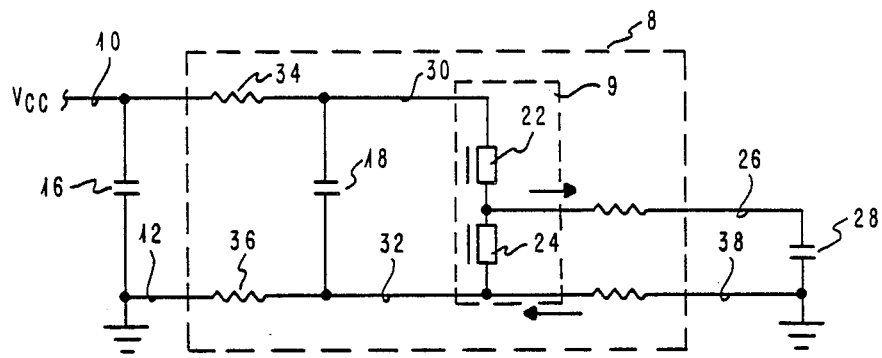
FIG. 1 is a circuit diagram illustrating the basic concept of the present invention.

Refer now to FIG. 1, which shows a circuit schematically illustrating a function performed by capacitors in the TAB package of the invention. An outline of a TAB package 8 is shown in phantom and the outline of the integrated circuit chip portion is shown at 9. Power lead 10 and ground lead 12 connect chip device 8 and a printed circuit board (not shown). A decoupling capacitor 16 is mounted across power lead 10 and ground lead 12 on the board.

A second capacitor 18 on the TAB package, supplies transient current to drive the load thereby greatly reducing the voltage drop across the device leads. Capacitor 18 may be either a surface mounted chip or film capacitor directly concerned to the polymer layer (not shown) of the TAB package. Complementary drivers 22 and 24, which may be drive transistors or FETS, represent an output-off-chip device driver stage. Signal line 26 goes to an off chip load represented by capacitor 28. Logic preceding drivers 22 and 24 is not shown. An on-chip power bus is represented by lines 30 and 32 feeding a number of driver stages of which drivers 22 and 24 represent only one. When a number of simultaneous drivers switch, transient current supplied by capacitor 18, reduces the voltage drop across TAB package leads 10 and 12 which because of their inductance 34, 36, respectively would otherwise be much higher. Since the inductance of the on-chip bus 30, 32 is much less than inductances 34, 36, voltage transients are minimized.

Signal line 26 is a single TAB signal lead feeding an off chip load (capacitor 28). A return ground lead 38 may support more than a single signal lead. The inductances 40 and 42 of TAB package leads and the transients thus produced are not affected by the packaging concept of this invention; only the inductances of 34, 36, which carry the current of many drivers such as drivers 22 and 24, is neutralized.

Figure 2:
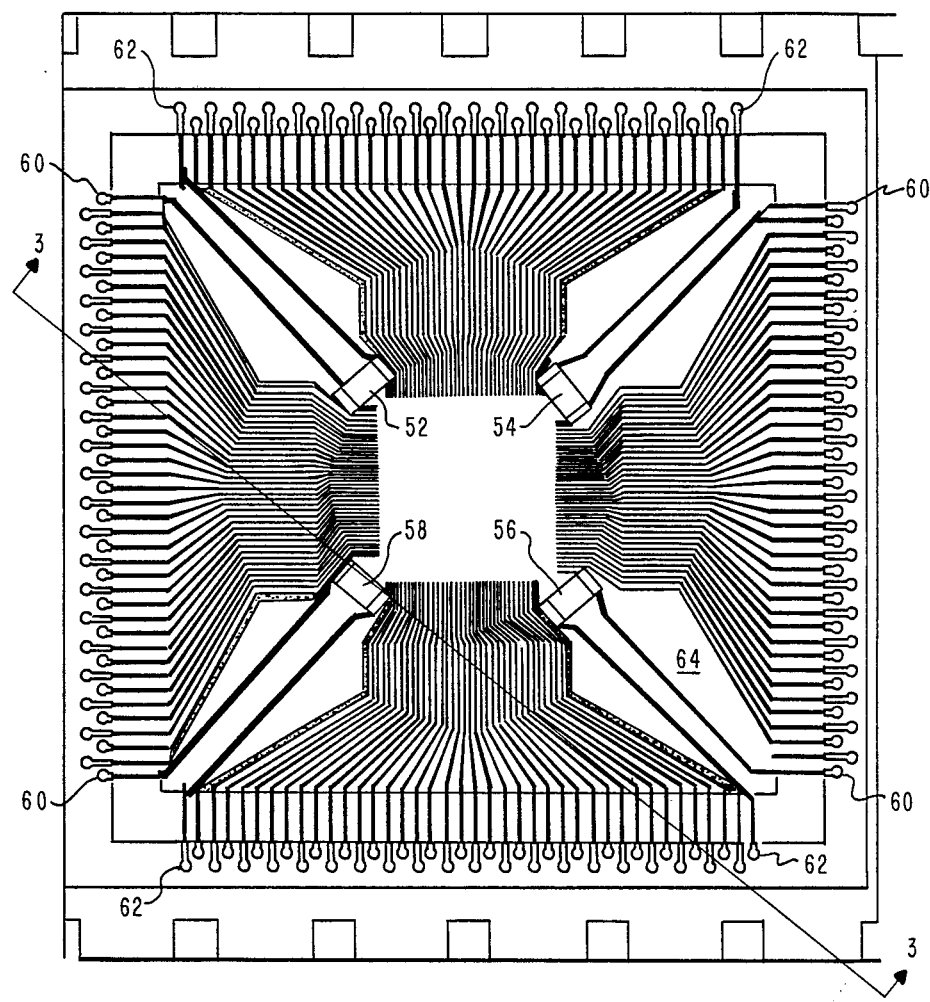
FIG. 2 is a plan view of a TAB package with surface mountable capacitors mounted on the polymer layer.

FIG. 2 shows a TAB package viewed from the side opposite that on which the semiconductor device is attached. Four capacitors 52, 54, 56 and 58 are shown mounted across the power 60 and ground 62 lines formed by conventional technology on flexible insulating polymer from 64 at each corner. Placing the power input leads 60, 62 parallel and close together, minimizes the effective inductance of the TAB lead by cancelling flux and provides a lower impedance path back to a capacitor (16, FIG. 1) on a printed circuit card.

Figure 3:
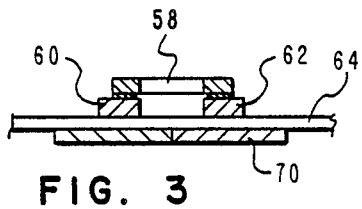
FIG. 3 is cross-sectional view of FIG. 2 taken along line 3—3.

FIG. 3 is a cross-sectional view of FIG. 2 taken along line 3—3 and shows capacitor 58, power and ground lines 60 and 62, polymer film 64 and a corner of an active integrated circuit device 70.

FIG. 4 is a plan view, again from the side of the TAB package opposite that on which the active integrated circuit device is mounted. This arrangement allows chip designers to place power leads in an array format on the underside of a chip 72 (not visible) as opposed to the conventional restriction of having all power leads connect on the periphery of the chip device. Openings 72 and 74 in polymer layer 64 allow connections from power input 76 and ground 78 lines to the chip. A capacitor 80 is mounted across power and ground lines 72 and 74 as described above with reference to FIG. 2.

Figure 5:
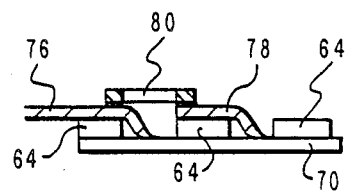
FIG. 5 is a cross-sectional view taken along line 5—5 of FIG. 4.
Figure 4:
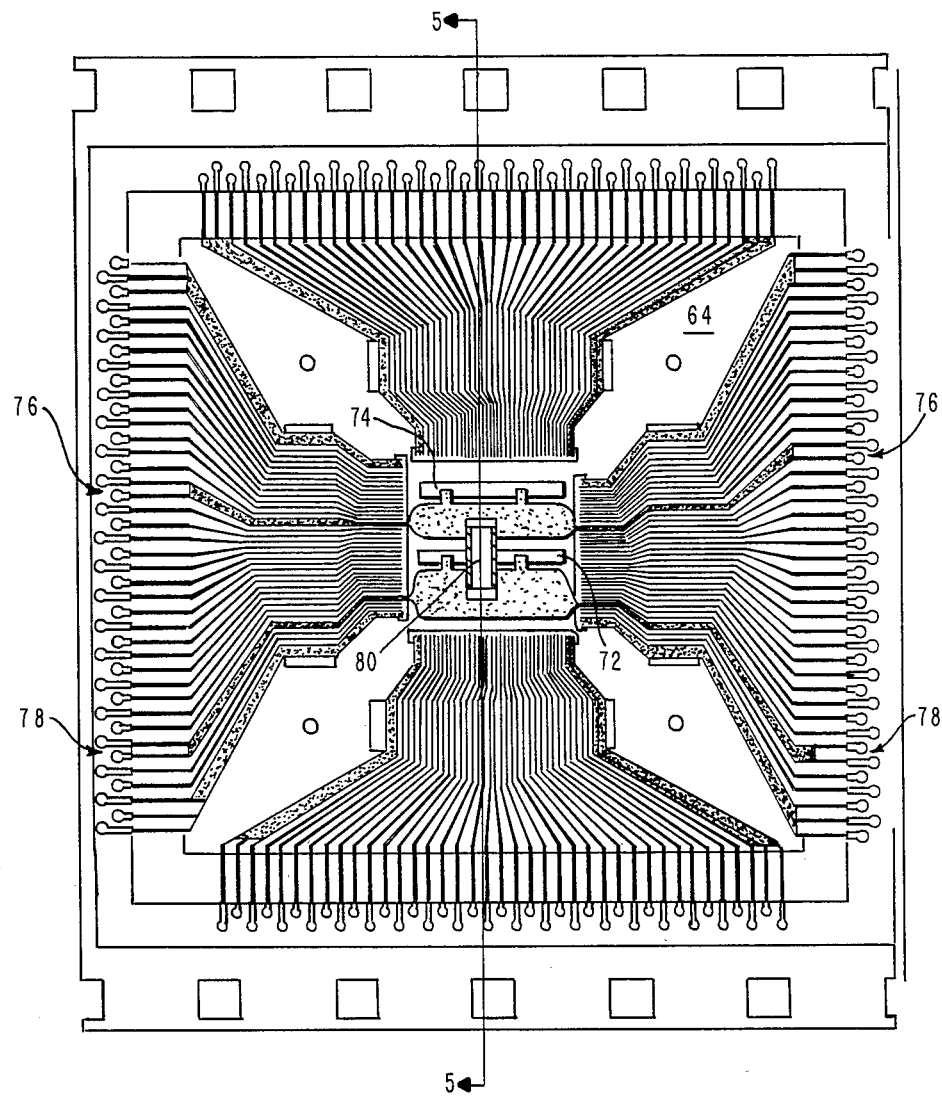
FIG. 4 is a plan view of capacitors mounted on the polymer layer so as to enable an array of I/O connections to the integrated circuit chip.

FIG. 5 shows a cross-sectional view of FIG. 4 taken along the line 5—5 and shows integrated circuit chip device 70, portions of polymer film layer 64, ground 78 and power 76 lines connected to chip 70. Capacitor 80 is mounted across power and ground lines, 76 and 78 respectively. Such an arrangement enhances conventional TAB packaging technology by allowing internal connections to the chip, that is, to areas of the chip internal to its periphery. Further, such an arrangement as shown in FIGS. 4 and 5 provides a package which may be electrically tailored to the semiconductor device by the designer who may require voltage and ground attachments in the center of the chip.

This improvement allows for voltage and ground to enter a TAB chip device from the sides a shown in FIG. 4 or from the corners. Since a large contact area is available over the chip, larger decoupling capacitors may be used. By bringing a bus in on the corners, (illustration not shown on FIG. 4) lower inductance inputs are possible without utilizing signal wiring area. Corner wiring is probably the preferred power entry for the described method of capacitor attachment.

Figure 6:
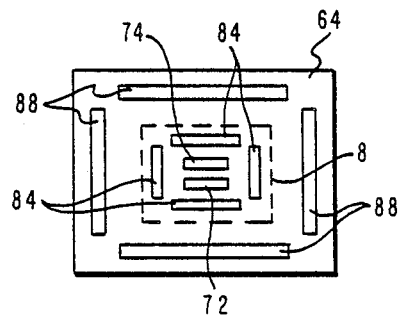
FIG. 6 illustrates a configuration of openings in the polymer layer of a TAB package in accordance with the present invention.

FIG. 6 is a schematic plan view of a portion polymer film 64 in the package shown in FIG. 5. The "footprint" of an integrated circuit chip device 8 is indicated in phantom. In addition to openings 72 and 74 shown in FIG. 5 for permitting internal power and ground connections to a chip, four peripheral openings 84 are shown at which conventional electrical connections are made between the chip and inner lead conductors (not shown) formed on polymer film 64. Openings 88 are provided for permitting electrical interconnection of the outer leads, ends of conductors formed on polymer film 64 and conductive lands on the surface of a printed circuit card substrate.

Figure 7:
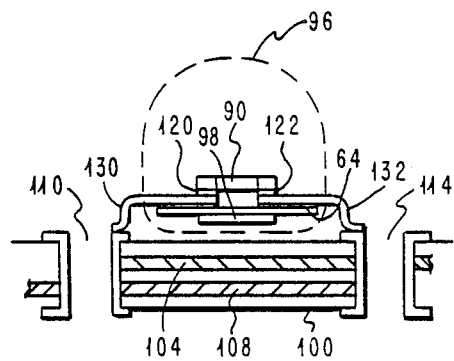
FIG. 7 schematically illustrates electrical connection of a TAB package embodying the present invention to a multi plane printed circuit card.

FIG. 7 schematically illustrates the connection of a decoupling capacitor 90, similar to capacitor 58 in FIG. 3 of capacitor 80 in FIG. 5, to the internal planes of a circuit board on which a TAB device package indicated generally at 96 and including an integrated circuit device 98 embodying the present invention, is mounted. A printed circuit board 100 includes internal power 104 and ground 108 planes. Plated through holes 110, 114 are also provided. Capacitor 90 is connected to conductive lands 120 and 122 of the TAB package 96 embodying the present invention. Leads 130 and 132 on the surface of polymer film 64 are electrically connected to circuit board 100 at lands associated with plated through holes 110 and 114. Device 98 is attached to TAB package polymer layer born conductors not visible in this Figure.

Clearly, the drawing figures are provided for illustrative purposes only, and those having skill in the art will understand the actual arrangement of power and ground lines and placement of capacitors is truly a function of the integrated circuit chip device design and intended function.

While the invention has been shown and described having reference to a particular preferred embodiment and modifications thereto, those having skill in the art will understand that other minor changes in form and detail may be made without departing from the spirit and scope of the invention as claimed.

We claim:

1. An improved semiconductor device TAB package for electrical connection to printed circuit substrate, having plural conductive planes comprising:
   a planar flexible insulating member;
   a pattern of conductive leads, including power and ground leads, formed on said flexible insulating member;
   at least a decoupling capacitor across adjacent ones of said power and ground leads;
   means for connecting said semiconductor device to first ends of at leaast some conductive leads in said pattern, said means comprising apertures in said flexible insulating member adapted for permitting direct attachment of said power and ground leads to interior sites on a surface of said semiconductor device or on peripheral edges of said device; and
   means for selectively connecting opposite ends of some of said conductive leads to surface circuitry and internal conductive planes of said circuit substrate.

2. An improved semiconductor device TAB package as described in claim 1 wherein:
   said apertures include one aperture of a size and shape substantially corresponding to the periphery of said semiconductor device; and
   said pattern of conductive leads includes having said first ends of all leads terminating at said one aperture.

3. An improved tape automated bonding package for a semiconductor device comprising:
   a polymer layer:
   a pattern of electrical leads formed on a surface of said polymer layer including signal, power and ground lines adapted for connection to said semiconductor and to circuitry on a printed circuit substrate;
   apertures in said polymer layer adjacent to a surface of said semiconductor device, through which power and ground connections to said device are made; and
   at least one decoupling capacitor surface mounted across said power and ground lines on said polymer layer.

4. A semiconductor device TAB package adapted for electrically connecting leads from a semiconductor device selectively to conductors on any plane of a multiplane printed circuit substrate comprising:

a planar flexible insulating member, having at least an aperture substantially smaller than said semiconductor device;

a plurality of conductive leads, including signal, power and ground leads, provided in a predetermined pattern about said aperture on said planar flexible member;

said pattern including at least one power lead and at least one ground lead passing through said aperture substantially smaller than said semiconductor device;

means for connecting said at least ones of said power and ground leads passing said aperture to said semiconductor device, through said aperture, at sites interior from peripheral edges of said semiconductor device; and at least a decoupling capacitor mounted across said at least ones of said power and ground leads in close proximity to said substantially smaller aperture.

5. A semiconductor chip device TAB package adapted for electrically connecting leads from said semiconductor chip device to any conductive plane in a printed circuit substrate having plural conductive planes comprising:

a planar flexible insulating member;

a pattern of conductive leads, inculding power and ground leads, formed on a surface said flexible insulating member, said pattern including having first ends of at least some of said conductive leads terminating at the edges of an area having a size and shape substantially corresponding to that of said semiconductor chip device, and at least one ground lead and at least one power lead traversing said area;

a plurality of apertures formed in said flexible insulating member in said area adjacent to said first ends of at least some conductive leads and in said area adjacent said at least one power leads and at least one ground lead;

means for connecting said first ends of at least some of said conductive leads to said semiconductor device through apertures located at sites corresponding to peripheral edges of said semiconductor device;

means for electrically connecting said at least one power lead and at least one ground lead to said semiconductor device at sites on said semiconductor device interior from edges of said semiconductor device through at least one aperture adjacent said at least one power lead and at least one ground lead; and at least a decoupling capacitor mounted across said at least one power lead and at least one ground lead in close proximity to one of said apertures.

* * * * *